United States Patent
Kobrin

(10) Patent No.: US 8,182,982 B2
(45) Date of Patent: *May 22, 2012

(54) METHOD AND DEVICE FOR PATTERNING A DISK

(75) Inventor: Boris Kobrin, Dublin, CA (US)

(73) Assignee: Rolith Inc, Dublin, CA (US)

(*) Notice: Subject to any disclaimer, the term of this patent is extended or adjusted under 35 U.S.C. 154(b) by 458 days.

This patent is subject to a terminal disclaimer.

(21) Appl. No.: 12/384,167

(22) Filed: Apr. 1, 2009

(65) Prior Publication Data

US 2009/0297989 A1    Dec. 3, 2009

Related U.S. Application Data

(63) Continuation-in-part of application No. PCT/US2008/012901, filed on Nov. 18, 2008.

(60) Provisional application No. 61/124,737, filed on Apr. 19, 2008.

(51) Int. Cl.
*G03F 7/20* (2006.01)
*G03B 27/00* (2006.01)

(52) U.S. Cl. .......................... 430/322; 355/18

(58) Field of Classification Search .................. None
See application file for complete search history.

(56) References Cited

U.S. PATENT DOCUMENTS

| | | | |
|---|---|---|---|
| 5,725,788 A | 3/1998 | Maracas et al. |
| 5,925,259 A | 7/1999 | Biebuyck et al. |
| 5,928,815 A | 7/1999 | Martin |
| 6,444,254 B1 | 9/2002 | Chilkoti et al. |
| 6,518,168 B1 | 2/2003 | Clem et al. |
| 6,753,131 B1 | 6/2004 | Rogers |
| 6,808,646 B1 | 10/2004 | Jeans |
| 7,144,539 B2 | 12/2006 | Olsson |
| 7,170,666 B2 | 1/2007 | Piehl et al. |
| 7,312,939 B2 | 12/2007 | Bandic |
| 7,476,523 B2 | 1/2009 | Schueller et al. |
| 7,567,774 B2 | 7/2009 | Yanagihara |
| 7,601,394 B2 | 10/2009 | Gorman et al. |

(Continued)

FOREIGN PATENT DOCUMENTS

CN    1735965    2/2006

(Continued)

OTHER PUBLICATIONS

Tapio Makela, Novel imprinting tool for roll to roll manufacturing of submicron structures, TNT2005, Aug. 29-Sep. 2, 2005, Oviedo, Spain.

(Continued)

*Primary Examiner* — Cynthia Kelly
*Assistant Examiner* — Anna Verderame
(74) *Attorney, Agent, or Firm* — Joshua D. Isenberg; JDI Patent

(57) ABSTRACT

Embodiments of the invention relate to methods and apparatus useful in the nanopatterning of rotationally symmetric disk materials, like magnetic and optical disks, where a rotatable mask is used to image a radiation-sensitive material. Typically the rotatable mask comprises a cone. The nanopatterning technique makes use of Near-Field photolithography, where the mask used to pattern the disk is in contact or close proximity with the disk. The Near-Field photolithography may make use of an elastomeric phase-shifting mask, or may employ surface plasmon technology, where a rotating cone surface comprises metal nano holes or nanoparticles.

12 Claims, 7 Drawing Sheets

U.S. PATENT DOCUMENTS

| | | | |
|---|---|---|---|
| 2004/0163758 A1 | 8/2004 | Kagan et al. | |
| 2005/0202185 A1 | 9/2005 | Greengarde et al. | |
| 2005/0224452 A1 | 10/2005 | Spiess et al. | |
| 2006/0014108 A1 | 1/2006 | Ito et al. | |
| 2006/0072295 A1 | 4/2006 | Goetzen | |
| 2007/0119048 A1 | 5/2007 | Li et al. | |
| 2007/0138699 A1 | 6/2007 | Wuister et al. | |
| 2007/0200276 A1 | 8/2007 | Mackey et al. | |
| 2008/0056768 A1 | 3/2008 | Yanagihara | |
| 2009/0136679 A1 | 5/2009 | Boukaftane et al. | |
| 2009/0170014 A1 | 7/2009 | Shibazaki | |
| 2009/0269705 A1* | 10/2009 | Kobrin | 430/322 |
| 2009/0305513 A1 | 12/2009 | Kobrin | |
| 2010/0003516 A1 | 1/2010 | Kobrin | |
| 2010/0018421 A1 | 1/2010 | Pan et al. | |
| 2010/0035163 A1* | 2/2010 | Kobrin | 430/2 |
| 2010/0123885 A1 | 5/2010 | Kobrin | |
| 2011/0024950 A1 | 2/2011 | Kruglick | |

FOREIGN PATENT DOCUMENTS

| | | |
|---|---|---|
| CN | 1943013 | 4/2007 |
| JP | 52-200419 | 11/1984 |
| JP | 59200419 | 11/1984 |

OTHER PUBLICATIONS

Hua Tan, Roller nanoimprint lithography, Journal of Vacuum Science and technology, B 16(6), Nov./Dec. 1998.

Dae-Geun Choi, Fluorinated organic-inorganic hybrid mold as a new stamp for nanoimprint and soft lithography, Langmuir, 21, p. 9390, 2005.

Yasuhisa Inao, Near-field lithography as prototype nano-fabrication tool, MNE-06 Micro- and Nano-Engineering, 2C-6, Photon Lithography.

R. Kunz, Large area patterning of 50 nm structures on flexible substrates using near-field 193 nm radiation, Journal of Vacuum Science and technology, B 21(1), Jan./Feb. 2003.

Joana Maria, Experimental and computational studies of phase shift lithography with binary elastimeric masks, Journal of Vacuum Science and technology, B 24(2), Mar./Apr. 2006.

Werayut Srituravanich, Plasmonic Nanolithography, Nanoletters, v.4, N6, p. 1085, 2004.

J.A. Maria A, S.Jeon A, J. Rogers; Nanopatterning With Comformable Phase Masks, Journal of Photochemistry and Photobiology A: Chemistry 166 (2004) 149-154.

Jing Zhao; Localized Surface Plasmon Resonance Viosensors, Nanomedicine 2006, 1(2), [219-228.

Peter Forbes; Self-Cleaning Materials: Lotus Leaf-Inspired Nanotechnology, Scientific American, Jul. 30, 2008.

Michael Berger; Moth Eyes Self-Cleaning Antireflection Nanotechnology Coatings, Nanowork, 2008.

D. Schaadt; Enhanced Semiconductor Optical Absortion via Surface Plasmon Excitation in Metal Nanoparticles, Appl.Phys.Lett, 86,063106, 2005.

S Price; Addressable, Larege-Area Nanoscale Organix Light-Emitting Diodes, Small, 2007, 3, No. 3, p. 372-374.

S Pillai; Surface Plasmon Enhanced Silicon Solar Cells, J.Appl.Phys, 101, 093105 (2007).

D Derkacs; Improved Performance of Amorphous Silicon Solar Cells via Scattering From Surface Plasmon Polaritons in Nearby Metalic Nanopa.Rticles, Appl.Phys.Lett, 89, 09310.

Zhaoning Yu; Fabrication of Large Area Subwavelength Antireflection Structures on Si Using Trilayer Resist Nanoimprint Lithgraphy and Liftoff, J.Ca.Sci.Techn B21(6).

Guoyong Xie; The Fabrication of Subwavelenth Anti-Reflection Nanostructures Using a Bio-Template, Nanotechnology 19(2008) 095605, p. 1-5.

Paul Roach; Progress in Superhydrophobic Surface Development, Soft Matter, 2008, 4, p. 224-240.

Bruce McLeaod; Thin-Films-Motheye Surfaces Reflect Little Light, Lase Focus World, Diplay Article, (36357).

J Wang; Dewetting of Conducting Polymer Inkjet Droplets of Patterned Surface, Nature Materials, V.3, Mar. 2004, p. 171-176.

L Creagh; Inkjet Printed Electronics: Moving to Production, Printed Electronincs USA 2007, Nov. 13-14, San Francisco, CA.

Y Xia; Soft Lithography, Annu.Rev.Mater.Sci, 1998, V.28, p. 153-184.

Stephen Y Chou, Peter R Krauss, Preston J Renstrom; Imprint Lithography With 25-Nanometer Resolution, Science Apr. 5, 1996, vol. 272, No. 5258, p. 85-87.

PCT Search Report mailed date Feb. 6, 2009; PCT/US2008/012901, filed on Nov. 18, 2008; Applicant Rolith.

Kobrin; Provisional Application, 61/124,737, "Fabrication of Nanophotonic Devices".

Non-Final Office Action mailed Sep. 12, 2011; 12/386,899, filed on Apr. 24, 2009, applicant Rolith.

Dae-Guen Choi, Jun-Ho Jeong, Young-Suk Sim, Eung-Sug Lee, Woo-Soo Kim, Byeong-Soo Bae; Fluorinated Organic-Inorganic Hybrid Mold as a New Stamp for Nanoimprint and Soft Lithography, Langmuir 2005 9390-9392.

Hua Tan, Andrew Gilbertson, Stephen Y Chou; Roller Nanoimprint Lithography, J.Vac.Sci. Technol. B 1998 3926-3928.

First Office Action for Chinese Patent Application No. 200880124519.3 dated Jul. 15, 2011.

* cited by examiner

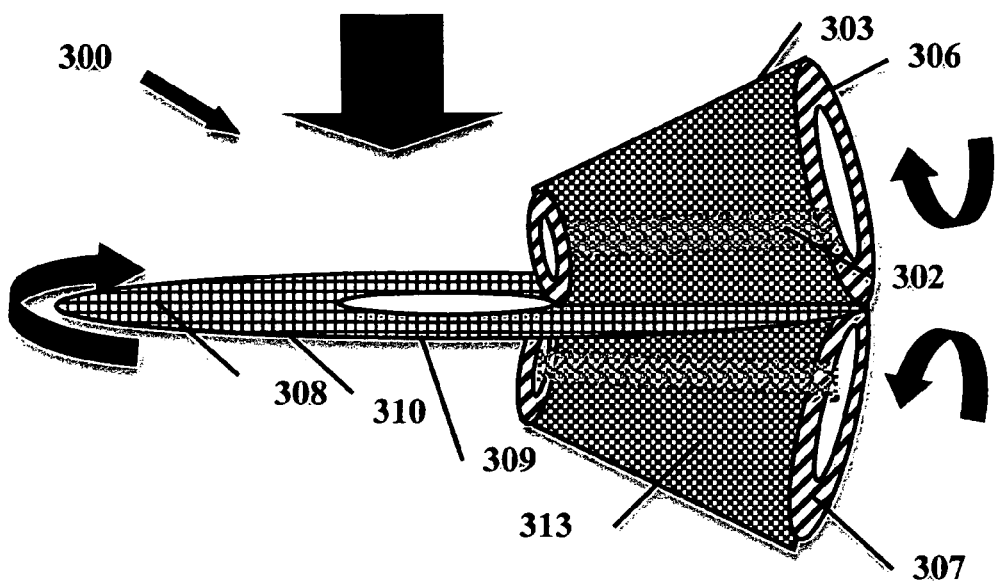
Fig. 3
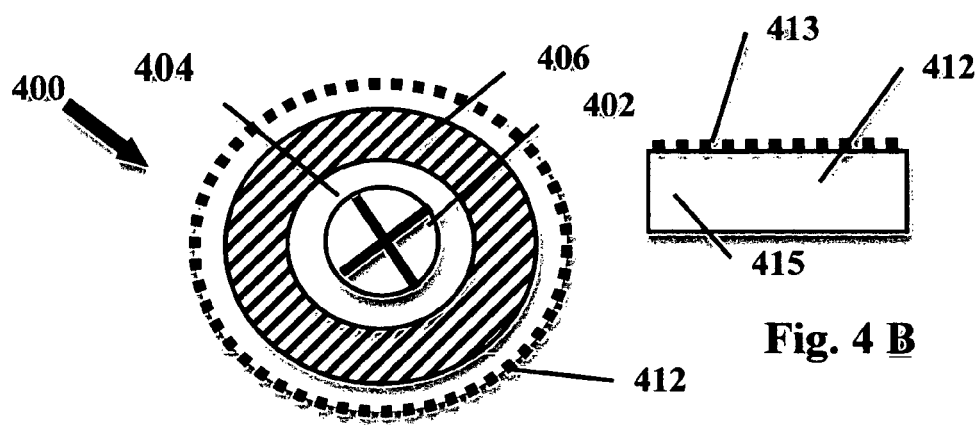
Fig. 4 A
Fig. 4 B

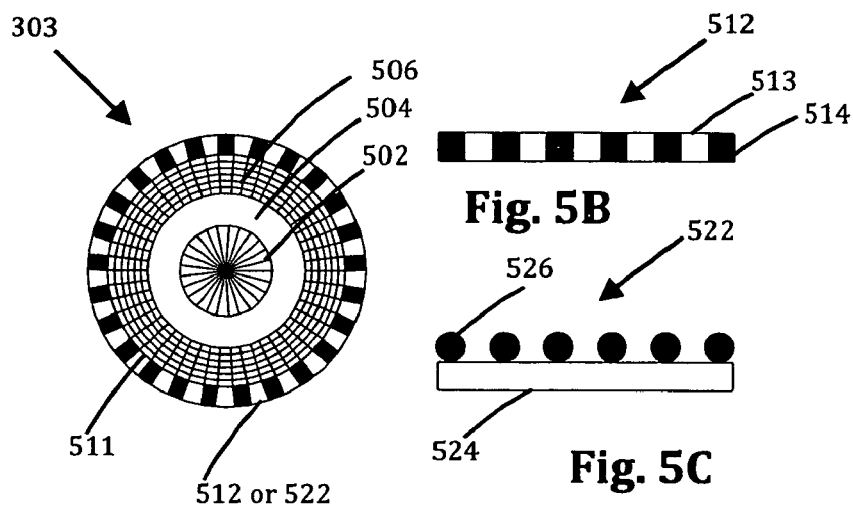
Fig. 5B
Fig. 5C
Fig. 5A
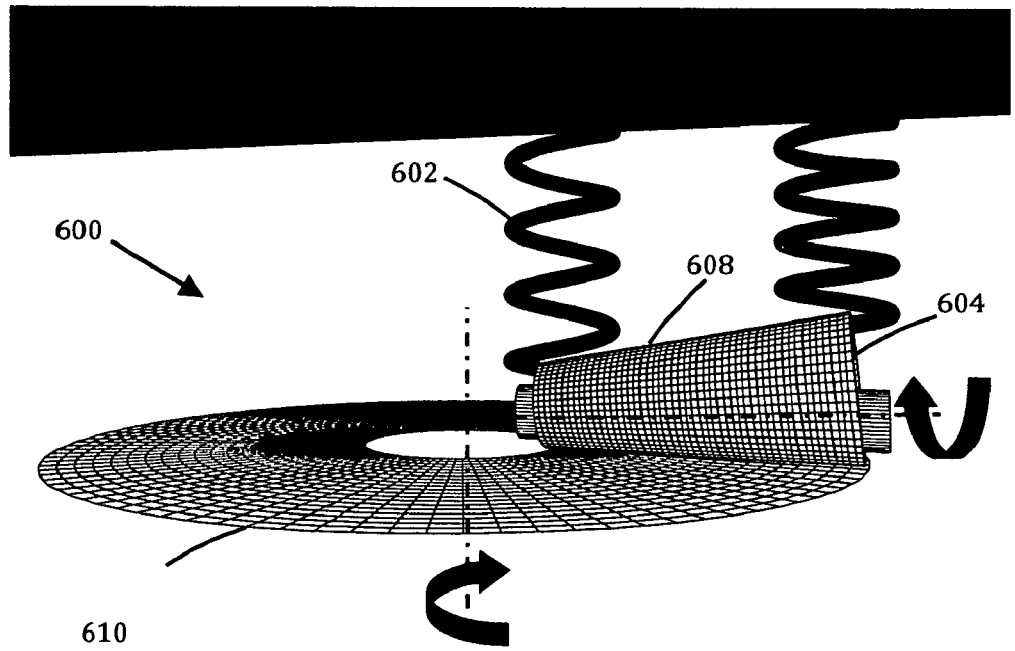
Fig. 6A

METHOD AND DEVICE FOR PATTERNING A DISK

This application claims the benefit of U.S. provisional Application No. 61/124,737, filed Apr. 19, 2008 and Continuation in part of PCT/US2008/012901 filed Nov. 18, 2008.

FIELD

Embodiments of the invention relate to nanopatterning methods which can be used to pattern rotationally symmetric objects, for example, disks for magnetic or optical data storage. Other embodiments of the invention pertain to apparatus which may be used to pattern substrates, and which may be used to carry out method embodiments, including the kind described.

BACKGROUND

This section describes background subject matter related to the disclosed embodiments of the present invention. There is no intention, either express or implied, that the background art discussed in this section legally constitutes prior art.

Nanostructuring is necessary for many present applications and industries and for new technologies which are under development. Improvements in efficiency can be achieved for current applications in areas such as solar cells and LEDs, and in next generation data storage devices, for example and not by way of limitation.

Conventional magnetic media consist of magnetic grains, each one free to assume its own magnetization state. The signal to noise ratio of the media is roughly proportional to the number of magnetic grains per bit. The superparamagnetic limit is reached at the point when grain becomes so small (<8 nm) that thermal energy alone can flip its magnetization direction. Today's disk drives have densities of 100 Gb/in2 with spacing of 86 nm. Increasing capacity to 1 Tb/in2 would require spacing of 27 nm, and 10 Th/in2-9 nm. For 500 Gb/in2 density and beyond alternative to optical lithography technologies such as thermally assisted recording (TAR) and patterned media (PM) are being considered as likely routes. Patterned Media (PM) has single-domain magnetic elements having a uniform well-defined shape and specific location on a disk.

Patterned media disks could potentially be fabricated using techniques such as e-beam direct writing, Deep UV lithography, nanosphere lithography, nanoimprint lithography, near-filed phase shift lithography, and plasmonic lithography, for example. Beam writing techniques are very slow, DUV lithography is too expensive. For now, Nanoimprint lithography considered the only feasible technology for low cost nanostructuring.

In Nanoimprint lithography scheme the patterned media master mold is fabricated using e-beam writing. Then, the mold is used to replicate a pattern to a number of individual disks. NanoImprint Lithography (NIL) creates patterns by mechanical deformation of an imprint resist, followed by subsequent processing. The imprint resist is typically a monomeric or polymeric formulation that is cured by heat or by UV light during the imprinting. There are a number of variations of NIL. However, two of the processes appear to be the most important. These are Thermoplastic NanoImprint Lithography (TNIL) and Step and Flash NanoImprint Lithography (SFIL).

TNIL is the earliest and most mature nanoimprint lithography. In a standard TNIL process, a thin layer of imprint resist (a thermoplastic polymer) is spin coated onto a sample substrate. Then a mold, which has predefined topological patterns, is brought into contact with the sample, and pressed against the sample under a given pressure. When heated above the glass transition temperature of the thermoplastic polymer, the pattern on the mold is pressed into a thermoplastic polymer film melt. After the sample, with impressed mold is cooled down, the mold is separated from the sample and the imprint resist is left on the sample substrate surface. The pattern does not pass through the imprint resist; there is a residual thickness of unchanged thermoplastic polymer film remaining on the sample substrate surface. A pattern transfer process, such as reactive ion etching, can be used to transfer the pattern in the resist to the underlying substrate. The variation in the residual thickness of unaltered thermoplastic polymer film presents a problem with respect to uniformity and optimization of the etch process used to transfer the pattern to the substrate.

Tapio Makela et al. of VTT, a technical research center in Finland, have published information about a custom built laboratory scale roll-to-roll imprinting tool dedicated to manufacturing of submicron structures with high throughput. Hitachi and others have developed a sheet or roll-to-roll prototype NIL machine, and have demonstrated capability to process 15 meter long sheets. The goal has been to create a continuous imprint process using belt molding (nickel plated molds) to imprint polystyrene sheets for large geometry applications such as membranes for fuel cells, batteries and possibly displays.

Hua Tan et al of Princeton University have published 2 implementations of roller Nanoimprint lithography: rolling cylinder mold on flat, solid substrate, and putting a flat mold directly on a substrate and rolling a smooth roller on top of the mold. Both methods are based on TNIL approach, where roller temperature is set above the glass transition temperature, Tg, of the resist (PMMA), while the platform is set to temperature below Tg. Currently the prototype tools do not offer a desirable throughput. In addition, there is a need to improve reliability and repeatability with respect to the imprinted surface.

In the SFIL process, a UV curable liquid resist is applied to the sample substrate and the mold is made of a transparent substrate, such as fused silica. After the mold and the sample substrate are pressed together, the resist is cured using UV light, and becomes solid. After separation of the mold from the cured resist material, a similar pattern to that used in TNIL may be used to transfer the pattern to the underlying sample substrate. Dae-Geun Choi from Korea Institute of Machinery suggested using fluorinated organic-inorganic hybrid mold as a stamp for Nanoimprint lithography, which does not require anti-stiction layer for demolding it from the substrate materials.

Hitachi GST has suggested a method of patterning a disk using a modification of Step-and-flash NIL, where entire disk is patterned using step-and-repeat imprinting of a fragment of the disk. This way the cost of the most expensive part of patterned disk production—e-beam writing of the master—can be reduced.

Since Nanoimprint lithography is based on mechanical deformation of resist, there are a number of challenges with both the SFIL and TNIL processes, in static, step-and-repeat, or roll-to-roll implementations. Those challenges include template lifetime, throughput rate, imprint layer tolerances, and critical dimension control during transfer of the pattern to the underlying substrate. The residual, non-imprinted layer which remains after the imprinting process requires an additional etch step prior to the main pattern transfer etch. Defects can be produced by incomplete filling of negative patterns and the shrinkage phenomenon which often occurs with respect to polymeric materials. Difference in thermal expansion coefficients between the mold and the substrate cause lateral strain, and the strain is concentrated at the corner of the pattern. The strain induces defects and causes fracture defects at the base part of the pattern mold releasing step.

Optical Lithography does not use mechanical deformation or phase change of resist materials, thus providing better feature replication accuracy. Though regular optical lithography is limited in resolution by diffraction effects some new optical lithography techniques based on near field evanescent effects have already demonstrated advantages in printing sub-100 nm structures, though on small areas only. Near-field phase shift lithography NFPSL involves exposure of a photoresist layer to ultraviolet (UV) light that passes through an elastomeric phase mask while the mask is in conformal contact with a photoresist. Bringing an elastomeric phase mask into contact with a thin layer of photoresist causes the photoresist to "wet" the surface of the contact surface of the mask. Passing UV light through the mask while it is in contact with the photoresist exposes the photoresist to the distribution of light intensity that develops at the surface of the mask. In the case of a mask with a depth of relief that is designed to modulate the phase of the transmitted light by $\pi$, a local null in the intensity appears at the step edge of relief. When a positive photoresist is used, exposure through such a mask, followed by development, yields a line of photoresist with a width equal to the characteristic width of the null in intensity. For 365 nm (Near UV) light in combination with a conventional photoresist, the width o the null in intensity is approximately 100 nm. A PDMS mask can be used to form a conformal, atomic scale contact with a flat, solid layer of photoresist. This contact is established spontaneously upon contact, without applied pressure. Generalized adhesion forces guide this process and provide a simple and convenient method of aligning the mask in angle and position in the direction normal to the photoresist surface, to establish perfect contact. There is no physical gap with respect to the photoresist. PDMS is transparent to UV light with wavelengths greater than 300 nm. Passing light from a mercury lamp (where the main spectral lines are at 355-365 nm) through the PDMS while it is in conformal contact with a layer of photoresist exposes the photoresist to the intensity distribution that forms at the mask.

Yasuhisa Inao, in a presentation entitled "Near-Field Lithography as a prototype nano-fabrication tool", at the 32nd International Conference on Micro and Nano Engineering in 2006, described a step-and-repeat near-field nanolithography developed by Canon, Inc. Near-field lithography (NFL) is used, where the distance between a mask and the photoresist to which a pattern is to be transferred are as close as possible. The initial distance between the mask and a wafer substrate was set at about 50 µm. The patterning technique was described as a "tri-layer resist process", using a very thin photoresist. A pattern transfer mask was attached to the bottom of a pressure vessel and pressurized to accomplish a "perfect physical contact" between the mask and a wafer surface. The mask was "deformed to fit to the wafer". The initial 50 µm distance between the mask and the wafer is said to allows movement of the mask to another position for exposure and patterning of areas more than 5 mm×5 mm. The patterning system made use of i-line (365 nm) radiation from a mercury lamp as a light source. A successful patterning of a 4 inch silicon wafer with structures smaller than 50 nm was accomplished by such a step-and-repeat method.

In an article entitled "Large-area patterning of 50 nm structures on flexible substrates using near-field 193 nm radiation", JVST B 21 (2002), at pages 78-81, Kunz et al. applied near-field phase shift mask lithography to the nanopatterning of flexible sheets (Polyimide films) using rigid fused silica masks and deep UV wavelength exposure. In a subsequent article entitled "Experimental and computational studies of phase shift lithography with binary elastomeric masks", JVST B 24(2) (2006) at pages 828-835, Maria et al. present experimental and computational studies of a phase shifting photolithographic technique that uses binary elastomeric phase masks in conformal contact with layers of photoresist. The work incorporates optimized masks formed by casting and curing prepolymers to the elastomer poly(dimethylsiloxane) against anisotropically etched structures of single crystal silicon on $SiO_2$/Si. The authors report on the capability of using the PDMS phase mask to form resist features in the overall geometry of the relief on the mask.

U.S. Pat. No. 6,753,131 to Rogers et al, issued Jun. 22, 2004, titled "Transparent Elastomeric, Contact-Mode Photolithography Mask, Sensor, and Wavefront Engineering Element", describes a contact-mode photolithography phase mask which includes a diffracting surface having a plurality of indentations and protrusions. The protrusions are brought into contact with a surface of a positive photoresist, and the surface is exposed o electromagnetic radiation through the phase mask. The phase shift due to radiation passing through indentations as opposed to the protrusions is essentially complete. Minima in intensity of electromagnetic radiation are thereby produced at boundaries between the indentations and protrusions. The elastomeric mask conforms well to the surface of the photoresist, and following development of the photoresist, features smaller than 100 nm can be obtained. (Abstract) In one embodiment, reflective plates are used exterior to the substrate and the contact mask, so radiation will be bounced to a desired location at a shifted phase. In another embodiment, the substrate may be shaped in a manner which causes a deformation of the phase shifting mask, affecting the behavior of the phase shifting mask during exposure.

Near Field Surface Plasmon Lithography (NFSPL) makes use of near-field excitation to induce photochemical or photophysical changes to produce nanostructures. The main near-field technique is based on the local field enhancement around metal nanostructures when illuminated at the surface plasmon resonance frequency. Plasmon printing consists of the use of plasmon guided evanescent waves through metallic nanostructures to produce photochemical and photophysical changes in a layer below the metallic structure. In particular, visible exposure ($\lambda$=410 nm) of silver nanoparticles in close proximity to a thin film of a g-line photoresist (AZ-1813 available from AZ-Electronic Materials, MicroChemicals GmbH, Ulm, Germany) can produce selectively exposed areas with a diameter smaller than $\lambda/20$. W. Srituravanich et al. in an article entitled "Plasmonic Nanolithography", Nanoletters V4, N6 (2004), pp. 1085-1088, describes the use of near UV light ($\lambda$=230 nm-350 nm) to excite SPs on a metal substrate, to enhance the transmission through subwavelength periodic apertures with effectively shorter wavelengths compared to the excitation light wavelength. A plasmonic mask designed for lithography in the UV range is composed of an aluminum layer perforated with 2 dimensional periodic hole arrays and two surrounding dielectric layers, one on each side. Aluminum is chosen since it can excite the SPs in the UV range. Quartz is employed as the mask support substrate, with a poly(methyl methacrylate) spacer layer which acts as adhesive for the aluminum foil and as a dielectric between the aluminum and the quartz. Poly (methyl methacrylate is used in combination with quartz, because their transparency to UV light at the exposure wavelength (i-line at 365 nm) and comparable dielectric constants (2.18 and 2.30, quartz and PMMA, respectively). A sub-100 nm dot array pattern on a 170 nm period has been successfully generated using an exposure radiation of 365 nm wavelength. Apparently the total area of patterning was about 5 µm×5 µm, with no scalability issues discussed in the paper.

Joseph Martin has suggested a proximity masking device for Near-filed lithography in U.S. Pat. No. 5,928,815, where cylindrical block covered with metal film for light internal reflection is used for directing light to the one end of the cylinder (base of cylinder), which contains a surface relief pattern. This block is kept in some proximity distance ("very small, but not zero") from the photoresist on the sample. Cylinder is translated in horizontal direction using some precise mechanism, which is used to pattern photoresist area.

The only published idea about using rollers for optical lithography can be found in the Japanese Unexamined Patent Publication, No. 59200419A, published Nov. 13, 1984, titled "Large Area Exposure Apparatus". Toshio Aoki et al. described the use of a transparent cylindrical drum which can rotate and translate with an internal light source and a film of patterned photomask material attached on the outside of the cylindrical drum. A film of a transparent heat reflective material is present on the inside of the drum. A substrate with an aluminum film on its surface and a photoresist overlying the aluminum film is contacted with the patterned photomask on the drum surface and imaging light is passed through the photomask to image the photoresist on the surface of the aluminum film. The photoresist is subsequently developed, to provide a patterned photoresist. The patterned photoresist is then used as an etch mask for an aluminum film present on the substrate.

There is no description regarding the kinds of materials which were used as a photomask film or as a photoresist on the surface of the aluminum film. A high pressure mercury lamp light source (500 W) was used to image the photoresist overlying the aluminum film. Glass substrates about 210 mm (8.3 in.)×150 mm (5.9 in.) and about 0.2 mm (0.008 in.) thick were produced using the cylindrical drum pattern transfer apparatus. The feature size of the pattern transferred using the technique was about 500 µm$^2$, which was apparently a square having a dimension of about 22.2 µm×22.2 µm. This feature size was based on the approximate pixel size of an LCD display at the time the patent application was filed in 1984. The photomask film on the outside of the cylindrical drum was said to last for approximately 140,000 pattern transfers. The contact lithography scheme used by Toshio Aoki et al. is not capable of producing sub-micron features.

There were not attempts to extend Near-filed Optical Lithography methods to pattern rotationally symmetric objects, for example, patterned media disks.

SUMMARY

Embodiments of the invention pertain to methods and apparatus useful in the nanopatterning of products having circular symmetry, by way of example and not by way of limitation. The nanopatterning technique makes use of Near-Field UV photolithography, where the mask used to pattern the substrate is in contact or in very close proximity (in the evanescent field, less than 100 nm) from the substrate. The Near-Field photolithography may include a phase-shifting mask or surface plasmon technology.

One embodiment the exposure apparatus which includes a phase-shifting mask in the form of a UV-transparent rotatable mask having specific phase shifting relief on it's outer surface. In another embodiment of the phase-shifting mask technology, the transparent rotatable mask, which is typically a cone, may have a polymeric film which is the phase-shifting mask, and the mask is attached to the cone's outer surface. When it is difficult to obtain good and uniform contact with the substrate surface, especially for large processing areas, it is advantageous to have the polymeric film be a conformal, elastomeric polymeric film such as PMDS, which makes excellent conformal contact with the substrate through Vander Waals forces. The polymeric film phase-shifting mask may consist of multiple layers. Where the outer layer is nanopatterned to more precisely represent prescribed feature dimensions in a radiation-sensitive (photosensitive) layer.

Another embodiment of the exposure apparatus employs a soft elastomeric photomask material, such as a PDMS film, having non-transparent features fabricated on one of it's surfaces, which is attached to the outer surface of the cone. Such feature may be chrome features produced on the PDMS film using one of the lithographic techniques known in the art.

In an embodiment of the exposure apparatus which includes surface plasmon technology, a metal layer or film is laminated or deposited onto the outer surface of the rotatable mask, which is typically a transparent cone. The metal layer or film has a specific series of through nanoholes. In another embodiment of the surface plasmon technology, a layer of metal nanoparticles is deposited on the transparent rotatable mask's outer surface, to achieve the surface plasmons enhanced nanopatterning. A radiation source is provided interior to the transparent cone. For example, and not by way of limitation, a UV lamp may be installed interior of the cone. In the alternative, the radiation source may be placed outside the cone, with light from the radiation source being piped to the interior of the cone through one or both ends of the cone. The radiation may be directed from outside the cone or within the cone toward particular areas within the interior of the cone using an optical system including mirrors, lenses, or combinations thereof, for example. Radiation present within the cone may be directed toward the mask substrate contact area using an optical grating. The radiation may be directed toward the mask substrate area (coupled) through a waveguide with a grating. The waveguide or grating is typically placed inside the cone, to redirect radiation toward the contact areas between the cone outer surface and the disk surface to be imaged.

In a specialized embodiment of a light source of radiation, an OLED flexible display may be attached around the exterior of the rotatable mask, to emit light from each of the pixels toward the substrate. In this instance the rotatable mask does not need to be transparent. In addition, the particular pattern to be transferred to a radiation-sensitive material on the substrate surface may be generated depending on the application, through control of the light emitted from the OLED. The pattern to be transferred may be changed "on the fly" without the need to shut down the manufacturing line.

Disk is patterned in a dynamic exposure mode, when a disk and a rotatable mask such as cone are moving against each other. The cone can be rotated on the disk surface when the disk is static or the disk is rotated while the cone's axis of symmetry is static. For reasons discussed below, there are advantages to rotating the disk rather than cone.

It is important to be able to control the amount of force which occurs at the contact line between the cone and the radiation-sensitive material on the surface of the disk (for example the contact line between an elastomeric nanopatterned film present on the surface of the cone and a photoresist on the disk surface). To control this contact line, the cone may be supported by a tensioning device, such as, for example, springs which compensate for the cone's weight. The disk or cone (or both) are moved (upward and downward) toward each other, so that a spacing between the surfaces is reduced, until contact is made between the cone surface and the radiation-sensitive material (the elastomeric nanopatterned film and the photoresist on the disk surface, for example). The elastomeric nanopatterned film will create a bond with a photoresist via Van-der Walls forces. The disk position is then moved back (downward) to a position at which the springs are elongated, but the elastomeric nanopatterned film remains in contact with the photoresist. The disk may then be moved toward the cone, forcing the cone to rotate, maintaining a dynamic contact between the elastomeric nanopatterned film and the photoresist on the disk surface. Alternatively, the cone can be rotated and the disk can be moved independently, but in synchronous motion, which will assure slip-free contact during dynamic exposure.

Multiple cones may be combined into one system and arranged to expose the radiation-sensitive surface of the disk in a sequential mode, to provide double, triple, and multiple patterning of the disk surface. This exposure technique can be used to provide higher resolution. The relative positions of the cones may be controlled by interferometer and an appropriate computerized control system.

Multiple cones may be combined into one system and arranged to expose the radiation-sensitive surfaces of the disk from the both sides of the disk to provide double-side patterning of the disk surface.

The pattern on the cone's surface may represent only a sector of the desired pattern on the disk, thus the entire disk pattern can be obtained by more than one turn of the cone on the surface of the disk.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

FIG. 3 shows a side view of another embodiment of an apparatus 300 useful in patterning a disk. In FIG. 3 a first transparent cone 306 with surface relief 303 is used to pattern the topside 308 of disk 310, while a second transparent cone 307 with surface relief 313 is used to pattern the bottom side 309 of disk 310.

FIG. 4 A shows a cross-sectional view of an embodiment 400 of a transparent cone 406 which includes a hollow center area 404 with an internal source of radiation 402. The surface relief area 412 is a conformal structure which includes polymer film 415 with a patterned surface 413 which is particularly useful for near-field lithography.

FIG. 4 B shows an enlargement of surface 413, which is a surface relief polymer structure 413 on top of polymeric base material 415. In FIG. 4B, the polymer base material 415 may be either the same polymeric material or may be a different polymeric material from the patterned surface material 413.

FIG. 5A shows a cross sectional view of an alternative embodiment 500 of surface relief 512 which is present on a hollow transparent cone 506.

FIG. 5B shows an enlargement of the surface relief 512, which is a thin metal layer 514 which is patterned with a series of nanoholes 513, where the metal layer is applied over the exterior surface 511 of hollow transparent cone 506.

FIG. 5C shows an alternative surface relief 522 which may be used on the surface of transparent cone 506. Surface relief 522 is formed by metal particles 526 which may be applied directly upon the exterior surface 511 of hollow transparent cone 506 or may be applied on a transparent film 524 which is attached to the exterior surface 511 of hollow transparent cone 506.

FIG. 6A is a schematic illustration 600 of a transparent cone 604 having a patterned surface 608, where the cone 604 is suspended above a disk 610 using a tensioning device 602 illustrated as springs.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

Embodiments of the invention relate to methods and apparatus useful in the nanopatterning of disks, where a rotatable mask is used to image a radiation-sensitive material. Typically the rotatable mask comprises a cone. The nanopatterning technique makes use of near-field photolithography, where the wavelength of radiation used to image a radiation-sensitive layer on a disk is 650 nm or less, and where the mask used to pattern the disk is in contact with the disk. The near-field photolithography may make use of a phase-shifting mask, or nanoparticles on the surface of a transparent rotating cone, or may employ surface plasmon technology, where a metal layer on the rotating cone surface comprises nano holes. The detailed description provided below is just a sampling of the possibilities which will be recognized by one skilled in the art upon reading the disclosure herein.

Figure 1A:
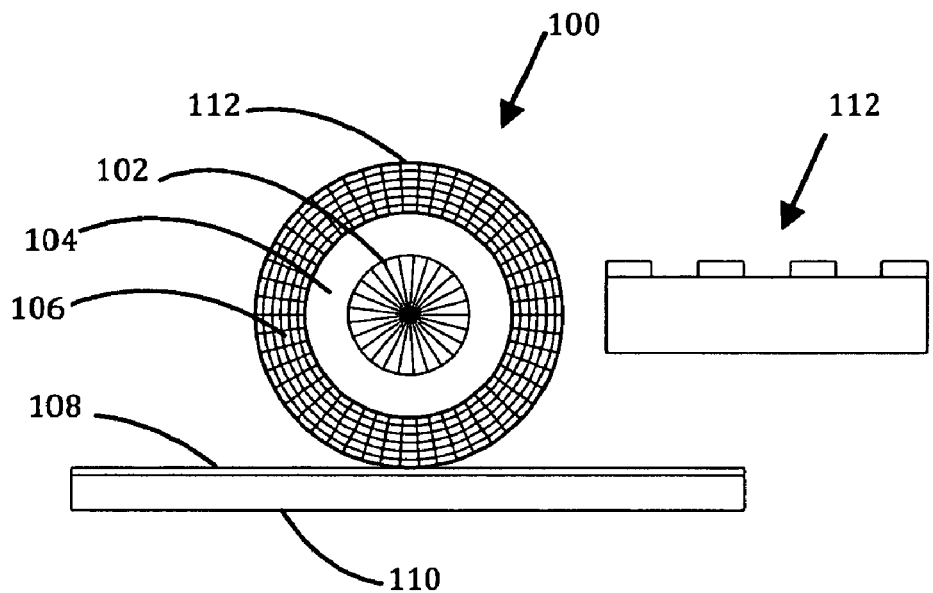
FIG. 1A shows a cross-sectional view of one embodiment of an apparatus 100 useful in patterning of disk material, where a radiation transparent cone 106 has a hollow interior 104 in which a radiation source 102 resides. In this embodiment, the exterior surface 111 of the cone 106 is patterned with a specific surface relief 112. The cone 106 rolls over a radiation sensitive material 108 which overlies a disk 110.
Figure 1B:
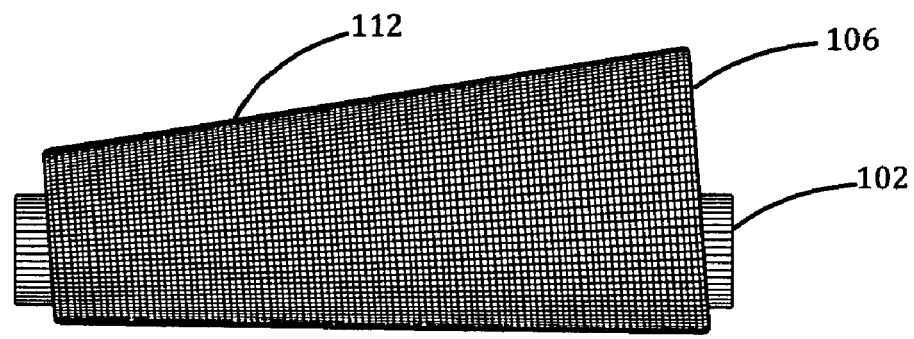
FIG. 1B side view of the radiation transparent cone 106 illustrated in FIG. 1A.

Although the rotating mask used to generate a nanopattern within a layer of radiation-sensitive material may be of any configuration which is beneficial, and a number of these are described below, a hollow cone is particularly advantageous in terms of imaged disk manufacturability at minimal maintenance costs. FIG. 1A shows a cross-sectional view of one embodiment of an apparatus 100 useful in patterning a disk, where a radiation transparent cone 106 has a hollow interior 104 in which a radiation source 102 resides. In this embodiment, the exterior surface 111 of the cone 106 is patterned with a specific surface relief 112. The cone 106 rolls over a radiation sensitive material 108 which overlies a disk 110. The rotatable cone 106 and the disk 110 are shown to be independently driven relative to each other. In another embodiment, the disk 110 may be kept in dynamic contact with a rotatable cone 106 and moved in a direction toward or away from a contact surface of the rotatable cone 106 to provide motion to an otherwise static rotatable cone 106. In yet another embodiment, the rotatable cone 106 may be rotated on a disk 110 while the disk is static. FIG. 1B shows a side view of the truncated cone 106 illustrated in FIG. 1A.

The specific surface relief 112 may be etched into the exterior surface of the transparent rotating cone 106. In the alternative, the specific surface relief 112 may be present on a film of polymeric material which is adhered to the exterior surface of rotating cone 106. The film of polymeric material may be produced by deposition of a polymeric material onto a mold (master). The master, created on a silicon substrate, for example, is typically generated using an e-beam direct writing of a pattern into a photoresist present on the silicon disk. Subsequently the pattern is etched into the silicon disk. The pattern on the silicon master mold is then replicated into the polymeric material deposited on the surface of the mold. The polymeric material is preferably a conformal material, which exhibits sufficient rigidity to wear well when used as a contact mask against a disk, but which also can make excellent contact with the radiation-sensitive material on the disk surface. One example of the conformal materials generally used as a transfer masking material is PDMS, which can be cast upon the master mold surface, cured with UV radiation, and peeled from the mold to produce excellent replication of the mold surface.

Figures 2A, 2B:
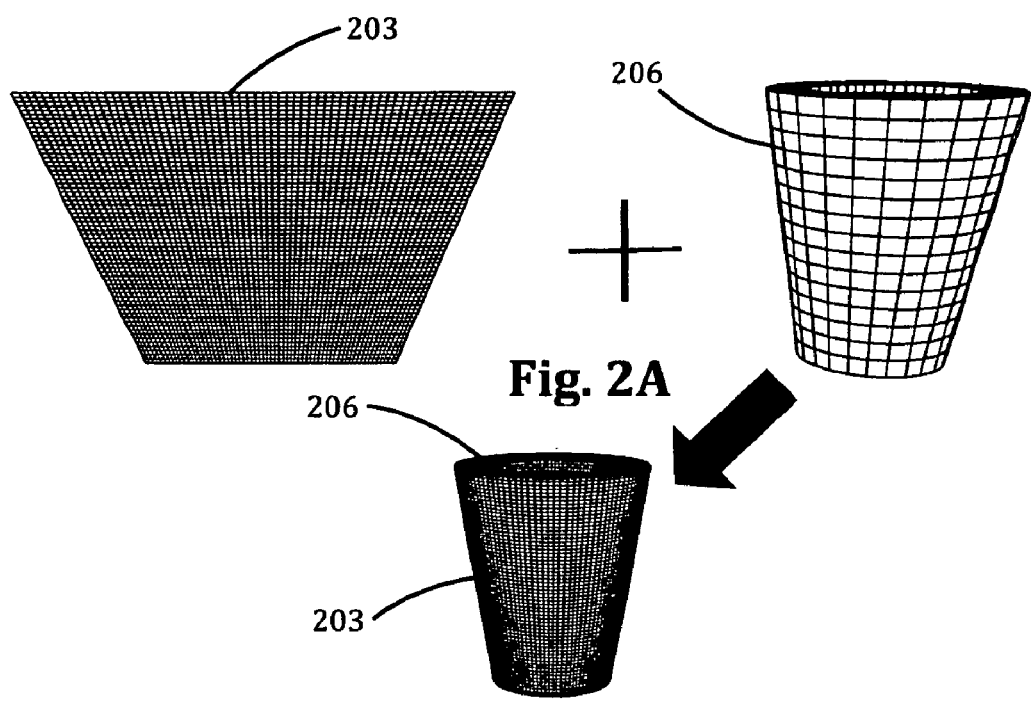
FIG. 2A shows a an embodiment of the apparatus 200 for patterning a disk where nanopatterned polymeric or metallic film 203 which is used as a phase shift mask or plasmonic mask for near-film lithography.
FIG. 2B shows a cone mask 206 with nanopatterned film 203 laminated on cone's surface.
Figure 2:
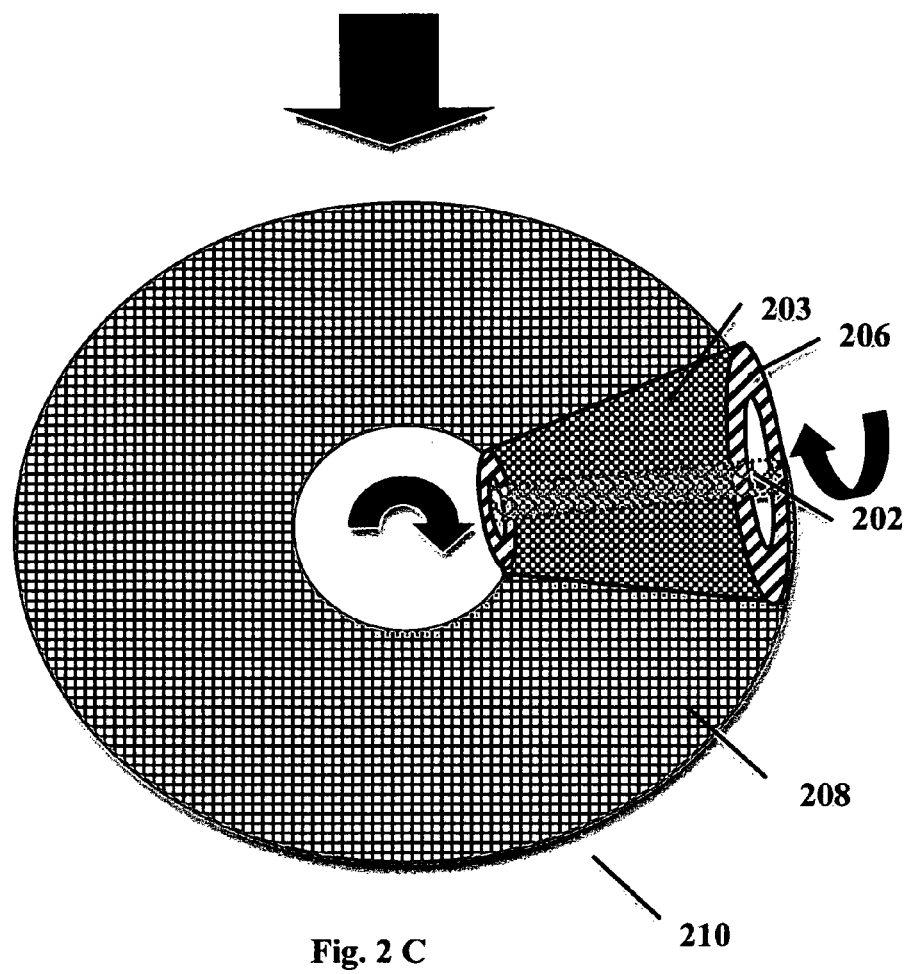
FIG. 2C shows a top view of the apparatus for patterning a disk, where rotatable cone mask 206 with laminated nanopatterned film 203 and a light source 202 place inside the cone 206, is brought in contact with the photosensitive layer 208 on the disk 210.
FIG. 2D shows a side view of the apparatus for patterning a disk, where rotatable cone mask 206 with laminated nanopatterned film 203 and a light source 202 place inside the cone 206, is brought in contact with the photosensitive layer 208 on the disk 210.
Figure 2:
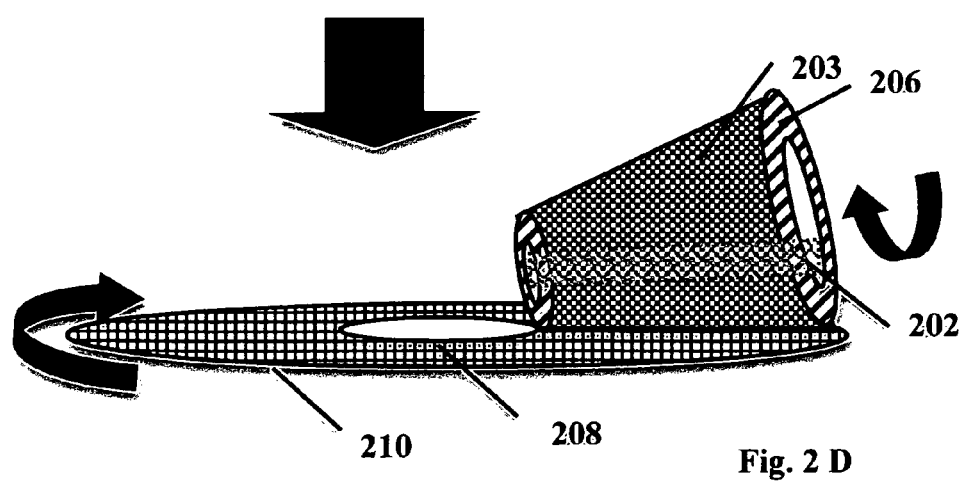

FIG. 2 shows an embodiment of the apparatus 200 for patterning a disk, where on FIG. 2A is shown a film 203, which is patterned with a desired pattern and then, as shown on FIG. 2B, this film is laminated on the transparent cone 206.

FIG. 2C shows top view of the apparatus, where cone 206 with the nanostructured film 203 laminated on it's surface and with the light source 202 placed inside the cone, is brought into the contact with the photosensitive layer 208 of the disk 210. Then when the disk 210 is rotated, for example, in counterclockwise direction, the cone tuned clockwise (if looking towards the center of the disk). FIG. 2D shows side view of the apparatus 200.

FIG. 3 shows a side view 300 of another embodiment of an apparatus for patterning a disk 310 from both sides of the disk 310, the front side 308 and a backside 309. Two cones are used in the setup, the first cone 306 and the second cone 307. The nanostructured film 312 laminated on the first cone 306 can be similar or different from the nanostructured films 313 laminated on the second cone 307. The disk 310 is positioned between two cones, 306 and 307, to provide frictional connection between them. Once the disk 310 is brought to rotational movement, both cones are rotated in different directions, one—cone 307—in counterclockwise, another—cone 306—in clockwise direction.

FIG. 4A shows a cross-sectional view 400 of an embodiment of a transparent cone 406 which includes a hollow center area 404 with an internal source of radiation 402. The surface relief 412 is a conformal structure which includes polymer film 415 with a patterned surface 413 which is particularly useful for near-field lithography. The polymeric material of patterned surface 413 needs to be sufficiently rigid that the pattern will contact a disk surface to be imaged in the proper location. At the same time, the polymeric material must conform to the surface of a radiation-sensitive material (not shown) which is to be imaged.

FIG. 4B shows an enlargement of surface 413, which is a surface relief polymer structure 413 on top of polymeric base material 415. In FIG. 4B, the polymer base material 415 may be either the same polymeric material or may be a different polymeric material from the patterned surface material 413. A transparent conformal material such as a silicone or PDMS, for example, may be used as polymer film 415, in combination with a more rigid transparent overlying layer of material, such as PDMS with a different ratio of mixing components, or polymethyl methacrylate PMMA, for example. This provides a patterned surface 413, which helps avoid distortion of features upon contact with a location on the radiation-sensitive surface of a disk (not shown), while the polymeric base material simultaneously provides conformance with the disk surface in general.

FIG. 5A shows a cross sectional view 500 of a transparent cone 506, with hollow central area 504 including a radiation source 502, where the surface 511 presents an alternative embodiment of surface relief 512. FIG. 5B shows an enlargement of the surface relief 512, which is a thin metal layer 514 which is patterned with a series of nanoholes 513, where the metal layer is present on the exterior surface 511 of hollow transparent cone 506. The metal layer may be a patterned layer adhered to the exterior surface of transparent cone 506. In the alternative, a metal layer may be deposited on the surface of the transparent cone by evaporation or sputtering or another technique known in the art and then may subsequently etched or ablated with a laser to provide a patterned metal exterior surface 511. FIG. 5C shows an alternative surface relief 522 which may be used on the surface of transparent cone 506. Surface relief 522 is formed by metal particles 526 which are applied on an exterior surface 511 of hollow transparent cone 506, or on a transparent film 524 which is attached to the exterior surface 511 of hollow transparent cone 506.

FIG. 6A is a schematic illustration 600 of a transparent cone 604 having a nanopatterned film 603 laminated on it's surface. A radiation source (not shown) is present within the interior of transparent cone 604. The transparent cone 604 is suspended above a disk 610 using a tensioning device 602, which is shown as springs in illustration 600. One of skill in the art of mechanical engineering will be familiar with a number of tensioning devices which may be used to obtain the proper amount of contact between the film 603 laminated on transparent cone 604 and the surface of disk 608. The transparent cone 604 is lowered toward the disk (or the disk is raised), until contact is made with the radiation-sensitive material 608. The polymeric film 603, which is typically elastomeric, will create a Van-der-Walls force bond with the radiation-sensitive material 608. The transparent cone 604 may then be raised (or the disk lowered) to a position where contact remains between the surface of the film 608 of transparent cone 604 and the surface of the radiation-sensitive material 608, but the tension between the two surfaces is such that the force placed on the surface 608 is minimal. This enables the use of very fine nanopatterned features on the surface 608 of transparent cone 604. When the disk 610 begins to move, the transparent cone 604 will also move, forcing transparent cone 604 to rotate, maintaining the dynamic contact between the radiation-sensitive material and the underlying polymeric film disk 610. At any moment of the dynamic exposure, the contact between the cone and a photosensitive layer is limited to one narrow line. Due to strong Van-der Walls forces between an elastomeric film, for example, on the cone exterior surface and the radiation sensitive (photo sensitive) layer on the disk, contact is maintained uniform throughout the entire process, and along the entire width of the mask (length) on the cone surface. In instances where an elastomeric material is not present on the cone surface which contacts the disk, an actuating (rotating) cone using a stepper-motor synchronized with the translational movement of the disk may be used. This provides a slip-free exposure process for polymeric or other cone surface material which does not provide strong adhesion forces relative to the disk.

Figure 6B:
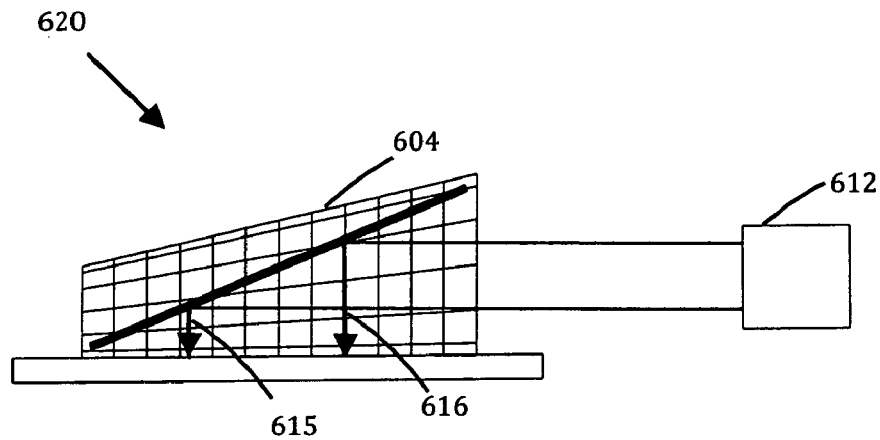
FIG. 6B is a schematic of an embodiment 620 where the radiation used to accomplish imaging is supplied from a radiation source 612 exterior to cone 604, with the radiation distributed internally 615 and 616 within the hollow portion of the cone 604.

FIG. 6B is a schematic of an embodiment 620 where the radiation used to accomplish imaging is supplied from a radiation source 612 exterior to cone 604, with the radiation distributed internally 615 and 616 within the hollow portion of the cone 604. The radiation may be directed through the transparent cone 604 through the patterned mask surface 603 toward the radiation-sensitive surface (not shown) of disk 608 using various lenses, mirrors, gratings, waveguides and combinations thereof.

Figure 7:
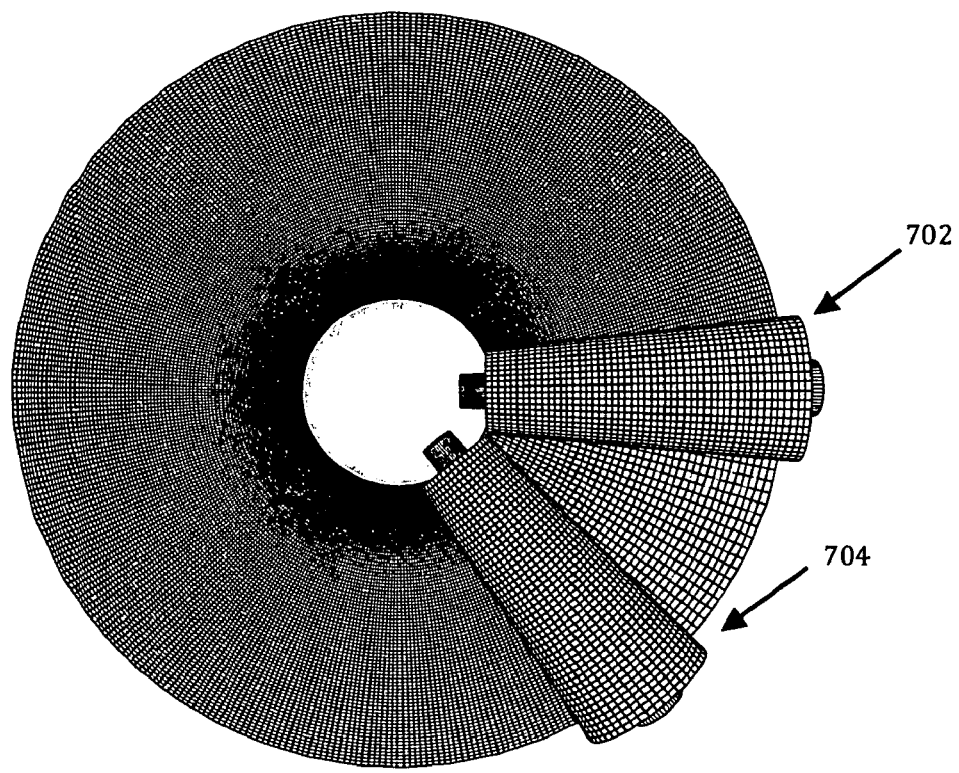
FIG. 7 is a schematic showing the use of multiple cones, such as two cones 702 and 704, for example, in series to provide multiple patterning, which may be used to obtain higher resolution, for example.

FIG. 7A is a schematic 700 showing the use of multiple cones, such as two cones 702 and 704, for example, in series to provide multiple patterning, which may be used to obtain higher resolution, for example. The relative positions of the cones 702 and 704, for example may be controlled using data from an interferometer (not shown) in combination with a computerized control system (not shown).

Figure 8:
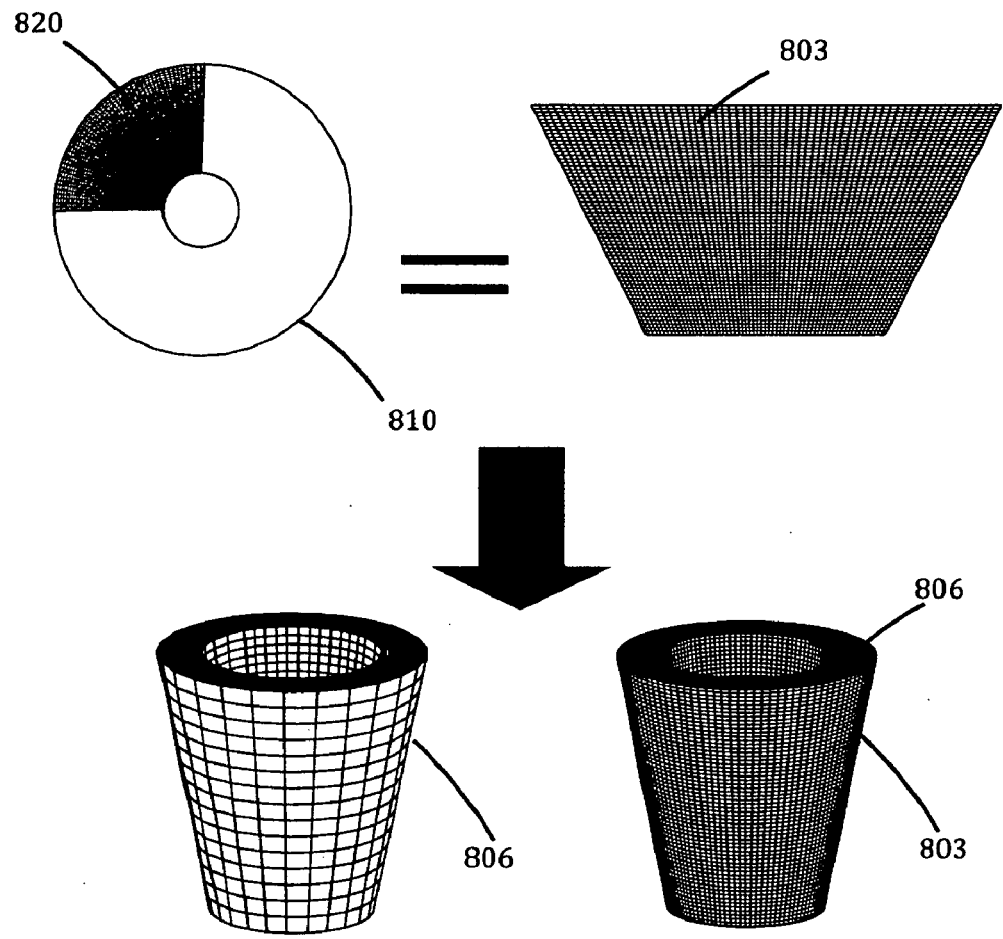
FIG. 8 is a schematic showing an example of a disk 810 consisting of 4 sectors having identical pattern 820. This pattern can be fabricated using the nanopatterned film 803 which is laminated on the cone 806. Such cone 806 can be used to pattern entire disk 810 rotating it 4 times during exposure process.

FIG. 8 is a schematic 800 demonstrating an embodiment when cone's surface 803 consists of only a fraction of the entire disk pattern, thus to pattern the entire disk cone has to turn multiple times. This is possible only if the desired disk pattern consists of repetitive sectors having the same pattern. FIG. 8, as an example only, represents a case of 4 similar sectors 820 of the disk 810, which is patterned by 4 turns of the cone 806, having a nanopatterned film 803 containing the pattern to be used to pattern each of 4 sectors of the disk. Using smaller area of the cone is beneficial in order to save the cost for the most expensive part of the fabrication—e-beam writing of the master.

In another embodiment, a liquid having a refractive index of greater than one may be used between the cone surface and a radiation sensitive (photo sensitive, for example) material present on the disk surface. Water may be used, for example. This enhances the pattern feature's contrast in the photosensitive layer.

While the invention has been described in detail for a variety of embodiments above, various modifications within the scope and spirit of the invention will be apparent to those of working skill in this technological field. Accordingly, the scope of the invention should be measured by the appended claims.

I claim:

1. A method of patterning a disk comprising:
 a) providing a disk having a radiation-sensitive layer on said disk;
 b) providing a rotatable mask having a shape of a cone and a nanopattern on an exterior surface of said rotatable mask;
 c) contacting said nanopattern with said radiation-sensitive layer on said disk;
 d) distributing radiation through said nanopattern, while rotating said rotatable mask over said radiation-sensitive layer, whereby an image having a feature size less than 500 nm is created in said radiation-sensitive layer.

2. A method in accordance with claim 1, wherein said nanopattern is a conformable nanopattern, which conforms to said radiation-sensitive layer on said disk.

3. A method in accordance with claim 2, wherein said conformable nanopattern is a shaped or nanostructured polymeric material.

4. A method in accordance with claim 1, wherein said rotatable mask is a phase-shifting mask which causes radiation to form an interference pattern in said radiation-sensitive layer.

5. A method in accordance with claim 1, wherein said mask employs surface plasmon behavior.

6. A method in accordance with claim 1, wherein said rotatable mask is a transparent cone, whereby radiation may be transmitted from a location interior of said cone.

7. A method in accordance with claim 6, wherein said mask is a phase shifting mask which is present as a relief on a surface of said transparent cone.

8. A method in accordance with claim 6, wherein said mask is a phase shifting mask which is present on a layer applied over a surface of said cone.

9. A method in accordance with claim 8, wherein at least one nanopatterned film is applied to an exterior surface of said cone, whereby imaged feature dimensions in said radiation-sensitive layer more precisely represent prescribed feature dimensions.

10. A method in accordance with claim 1, wherein said disk is kept in dynamic contact with said rotatable cone and rotated during distribution of radiation from the contact surface of said cone.

11. A method in accordance with claim 1, wherein said rotatable mask and said disk are moved independently using a stepper-motor and a motorized disk rotational mechanism, and wherein movement of said rotatable mask and said disk surface are synchronized with each other, whereby a slip-free contact exposure of said radiation-sensitive layer is achieved.

12. A method in accordance with claim 1 wherein said nanopattern on an exterior surface of the cone is a fraction of a repetitive nanopattern created on the disk, obtained by more than one turns of said cone.

* * * * *